United States Patent
Henrion

(10) Patent No.: US 7,515,667 B2
(45) Date of Patent: Apr. 7, 2009

(54) METHOD AND APPARATUS FOR REDUCING SYNCHRONIZER SHADOW

(75) Inventor: Carson D. Henrion, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 618 days.

(21) Appl. No.: 11/271,398

(22) Filed: Nov. 9, 2005

(65) Prior Publication Data

US 2007/0104302 A1    May 10, 2007

(51) Int. Cl.
*H04L 7/00* (2006.01)
(52) U.S. Cl. ..................................... 375/354
(58) Field of Classification Search ............. 375/354
See application file for complete search history.

(56) References Cited

U.S. PATENT DOCUMENTS

| | | | | |
|---|---|---|---|---|
| 5,995,080 | A * | 11/1999 | Biro et al. ................... | 345/603 |
| 6,173,435 | B1 * | 1/2001 | Dupenloup .................. | 716/18 |
| 6,359,479 | B1 * | 3/2002 | Oprescu ..................... | 327/141 |
| 6,681,337 | B1 * | 1/2004 | Smith et al. ................. | 713/400 |
| 6,987,404 | B2 * | 1/2006 | Duncan ...................... | 327/141 |
| 7,003,423 | B1 * | 2/2006 | Kabani et al. ............... | 702/120 |
| 7,096,177 | B2 * | 8/2006 | Hertwig et al. .............. | 703/21 |
| 2002/0178392 | A1 * | 11/2002 | Marx et al. ................. | 713/500 |
| 2003/0123588 | A1 * | 7/2003 | Parikh ........................ | 375/354 |
| 2004/0165611 | A1 * | 8/2004 | Govindarajan et al. ...... | 370/428 |
| 2004/0236977 | A1 * | 11/2004 | Kizer et al. ................. | 713/500 |

OTHER PUBLICATIONS

Kim, "A parallel flop synchronizer for bridging asynchronous clock domains", Proceedings of 2004 IEEE Asia-Pacific Conference on Advanced System Integrated Circuits 20044-5 Aug. 2004 pp. 184-187.*

Semiat, "Timing measurements of synchronization circuits", Proceedings. Ninth International Symposium on Asynchronous Circuits and Systems, 2003, May 12-15, 2003 pp. 68-77.*

Petre, "Increasing the fault coverage in multiple clock domain systems by using on-line testing of synchronizers", Proceedings. Seventh International On-Line Testing Workshop, 2001, Jul. 9-11, 2001 pp. 95-99.*

* cited by examiner

*Primary Examiner*—Juan A Torres

(57) ABSTRACT

In one embodiment, a method for reducing synchronizer shadow involves: 1) receiving and deserializing a serialized data flit of known length, under control of a first clock domain; 2) before receiving all of the serialized data flit, beginning to resolve a valid signal for the deserialized data flit in a second clock domain; 3) upon receiving and deserializing all of the serialized data flit, latching the deserialized data flit under control of the first clock domain; and 4) after latching the deserialized data flit, and a predetermined number of clock edges of the second clock domain after beginning to resolve the valid signal, i) resolving the valid signal; and ii) transferring the latched data flit into the second clock domain in response to the valid signal.

20 Claims, 10 Drawing Sheets

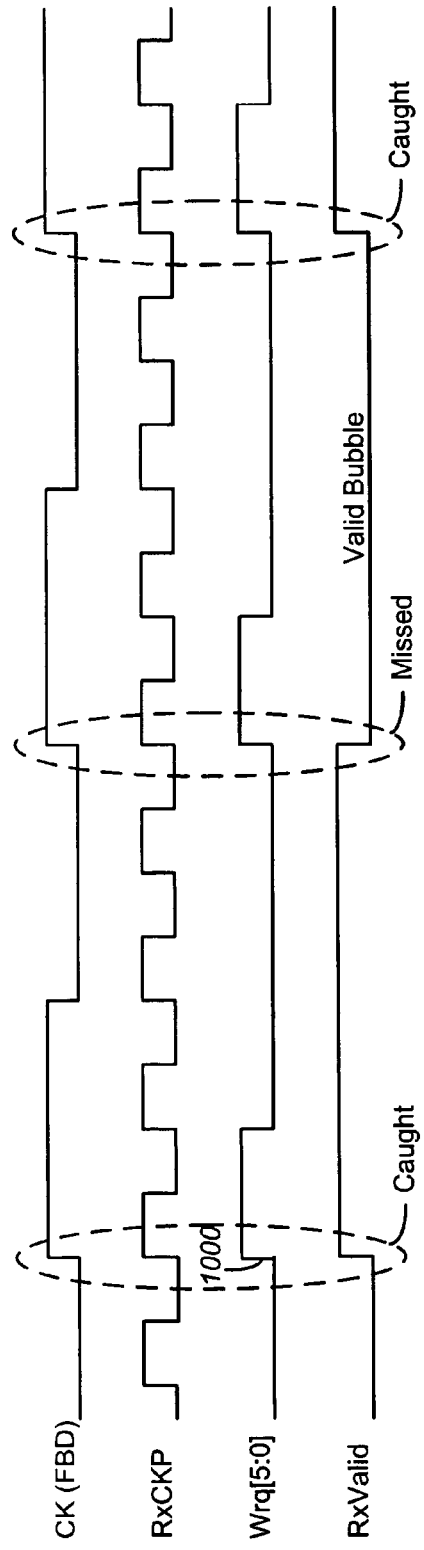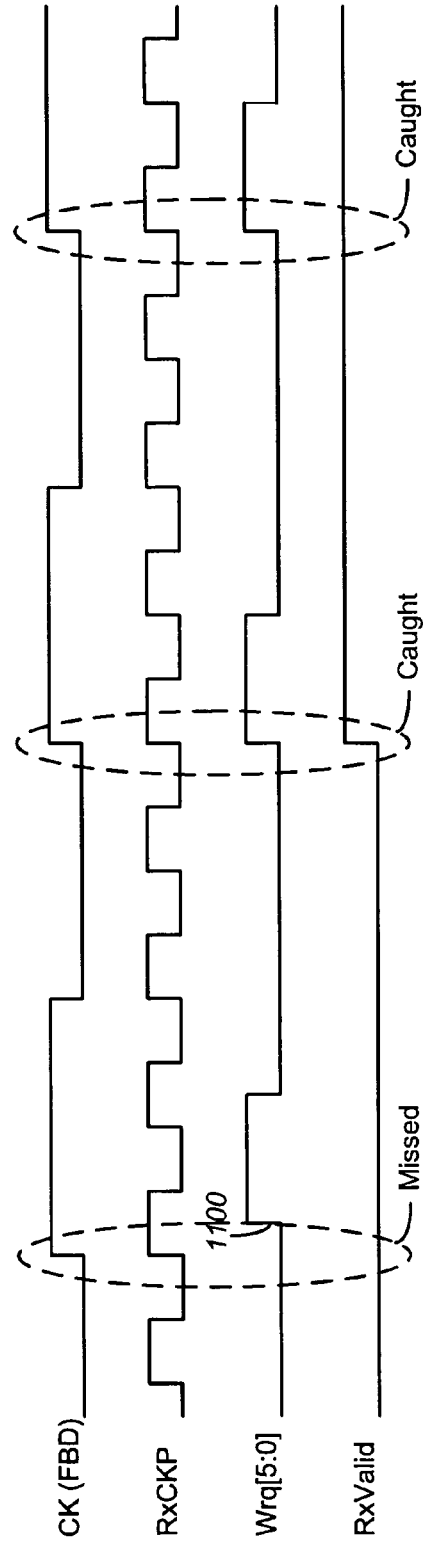

METHOD AND APPARATUS FOR REDUCING SYNCHRONIZER SHADOW

BACKGROUND

In the context of digital signaling, "synchronization" is the process of latching a signal between first and second non-aligned clock domains. Absent proper controls, the result of this latching can be somewhat unpredictable. There are three scenarios: a signal to be latched can be caught, a signal to be latched can be caught on the next clock edge, or a signal to be latched can be partly caught. The last scenario is the worst, as a "meta-stable" value (i.e., a value that is neither a "1" nor a "0") can be latched. A latch that is in a meta-stable state can persist in this state for a long period of time, especially if the latch has low gain (or feedback). The latch can then propagate its meta-stable value to other circuits, which can cause illegal states and other problems.

To prevent the latching of a meta-stable state, a special latch with high gain is typically used. This latch is called a "resolving latch". In addition, the latch is given enough time to resolve, such that any meta-stable value has been forced to a "0" or a "1" before it is sent to other circuits. However, even with these techniques, meta-stable events will theoretically occur if given enough time (perhaps 10,000 years).

Synchronization is accomplished by a "synchronizer". Traditionally, a synchronizer waits for incoming data to arrive, and then synchronizes the data into the new clock domain. The resolve time of the synchronizer is typically a multiple or fraction of cycles of the new clock domain (e.g., ½, 1, 1½, 2 . . . ). This granularity can often force difficult decisions and/or design requirements. For example, designing a more aggressive resolving latch may be able to regain ½ cycles of latency, but at an increased cost and using more chip area.

BRIEF DESCRIPTION OF THE DRAWINGS

Illustrative embodiments of the invention are illustrated in the drawings, in which:

FIGS. 10 & 11 illustrate alternate signal timings for the apparatus shown in FIG. 2, depending on whether received data has a data type of Fully Buffered DIMM (FBD).

DETAILED DESCRIPTION

In a synchronizer, the data crossing the synchronizer boundary waits for its valid signal to be resolved into the next clock domain. This waiting time is referred to as the "synchronizer shadow".

Traditionally, a synchronizer waits for incoming data to arrive, and then synchronizes the data into a new clock domain. However, in the method and apparatus disclosed herein, the duration of the synchronizer shadow is reduced by beginning to resolve a valid signal for incoming data before all of the incoming data is received. The method and apparatus disclosed herein are therefore especially advantageous when the clock domain into which incoming data is synchronized is much slower than the clock domain of the incoming data.

Figure 1:
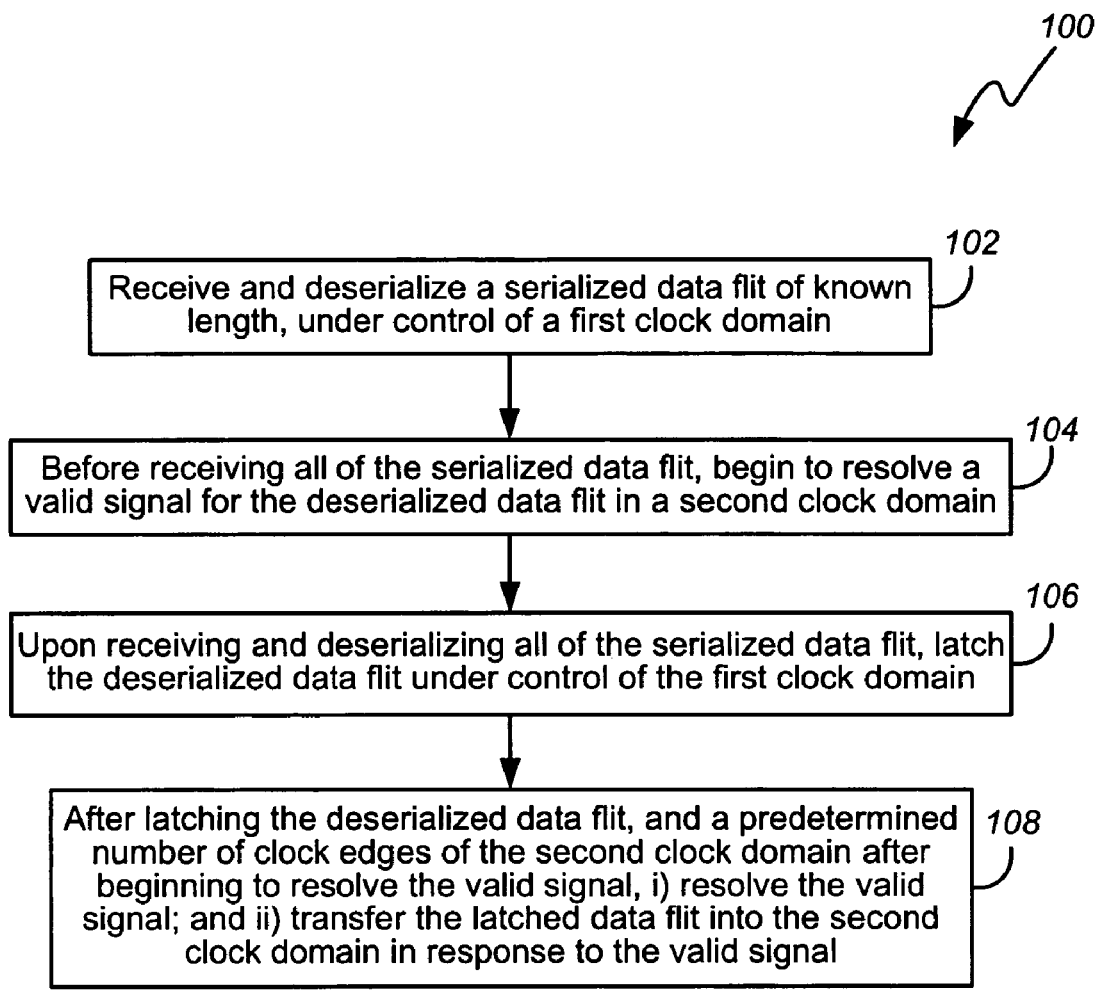
FIG. 1 illustrates an exemplary method for reducing synchronizer shadow.

Turning now to FIG. 1, there is shown an exemplary method 100 for reducing synchronizer shadow. The method 100 comprises receiving and deserializing 102 a serialized data flit of known length, under control of a first clock domain (i.e., a clock domain to which the serialized data flit is aligned during transmission). As defined herein, a "serialized data flit" is simply a serialized group of data bits.

Before receiving all of the serialized data flit, the resolve of a valid signal for the deserialized data flit is begun 104 in a second clock domain (i.e., a clock domain in which the deserialized data flit is aligned upon receipt). Then, upon receiving and deserializing all of the serialized data flit, the deserialized data flit is latched 106 under control of the first clock domain.

After latching the deserialized data flit under control of the first clock domain, and a predetermined number of clock edges of the second clock domain after beginning to resolve the valid signal, the valid signal is resolved 108, and the latched data flit is transferred 108 into the second clock domain in response to the valid signal.

Using the method 100 of FIG. 1, the duration of synchronizer shadow can be dramatically reduced, without decreasing a synchronizer's reliability. Also, or alternately, the design requirements of a receiver's synchronizer and latching circuits can be significantly relaxed.

In some embodiments of the method 100, the time at which the valid signal begins to resolve may be adjusted in response to a data type of a data flit. For example, in some cases, a receiver may be capable of receiving data types such as:

Fully Buffered Dual Inline Memory Module (FBD) for communication with memory chips;

Scalable POWER parallel 2 (SP2) and Common Systems Interconnect (CSI), which are INTEL® standards for communication between central processing units (CPUs) and chip sets;

WindJammer Fabric (WJF), which is HEWLETT-PACKARD COMPANY's® proprietary chip interconnect protocol; and 8b10b, which is a special encoding of WJF for transmission over fiber optics Depending on which of these data types is received, including the length of any corresponding data flit, it may be necessary (or at least possible) to begin resolving a data flit's valid signal sooner or later.

In the same or different embodiments of the method 100, it may also be useful to adjust the number of clock edges between 1) beginning to resolve the valid signal, and 2) resolving the valid signal. For example, for a receiver that is capable of receiving the above listed data types, certain data types may be compatible with allowing an earlier resolve than others. As will be explained in more detail later in this description, the number of clock edges over which a valid signal is resolved may be set in response to an offset signal corresponding to a data flit.

Figure 2:
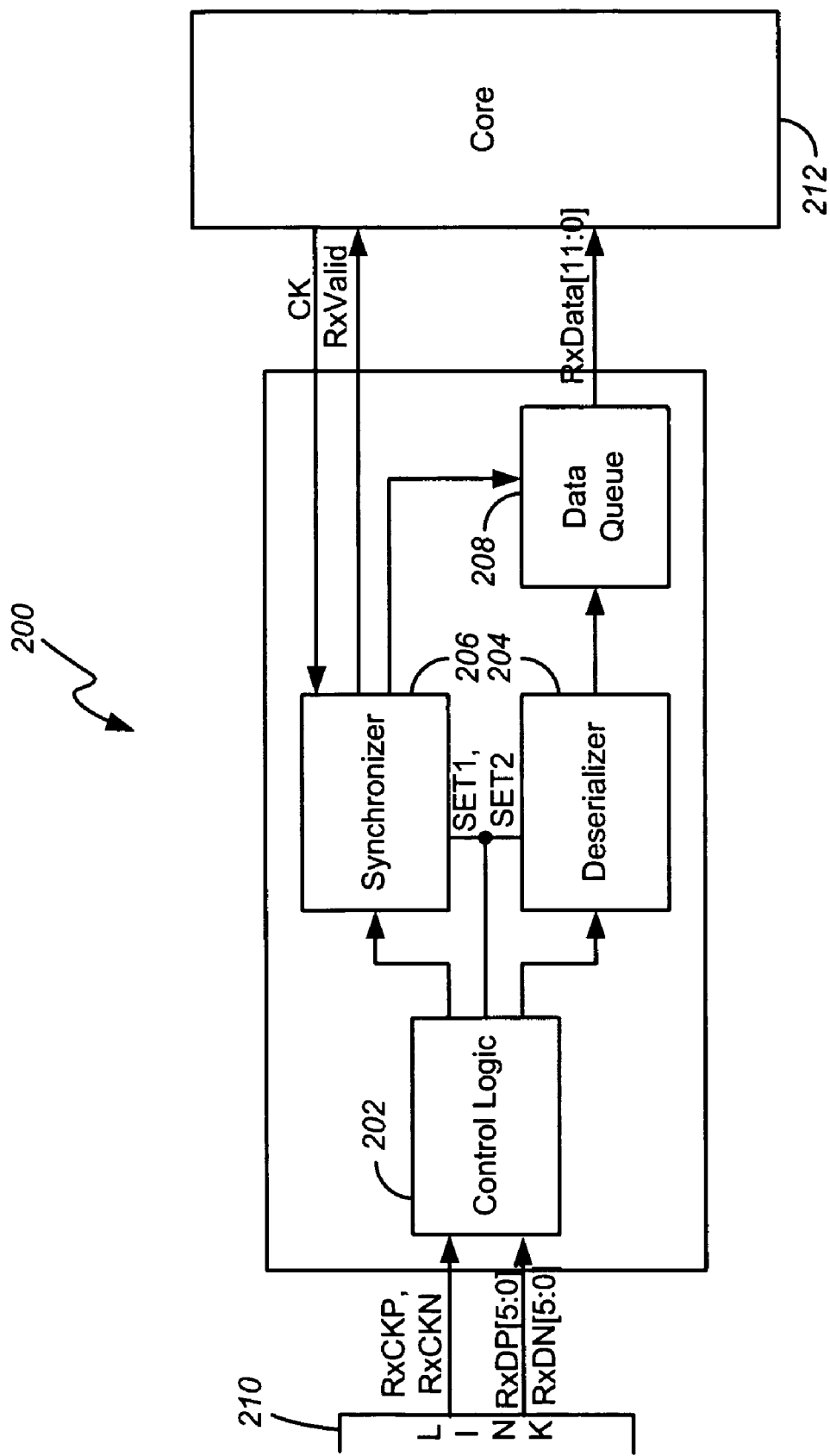
FIG. 2 illustrates a high level view of exemplary apparatus for reducing synchronizer shadow.

FIG. 2 illustrates an exemplary embodiment of apparatus 200 that may be used to implement the method 100 and other methods. In general, the apparatus comprises control logic 202, a deserializer 204, a synchronizer 206 and a data queue 208. The control logic 202 is coupled to receive clock, data and control signals from a data link (or bus) 210; and the data queue is coupled to provide valid data to a device core 212.

Of note, the control logic 202 and deserializer 204 operate under the clock domain of the link 210 (i.e., under clocks RxCKP and RxCKN), and the synchronizer 206 and data queue 208 operate partially under the clock domain of the link 210, and partially under the clock domain (CK) of the device core 212.

Figure 3:
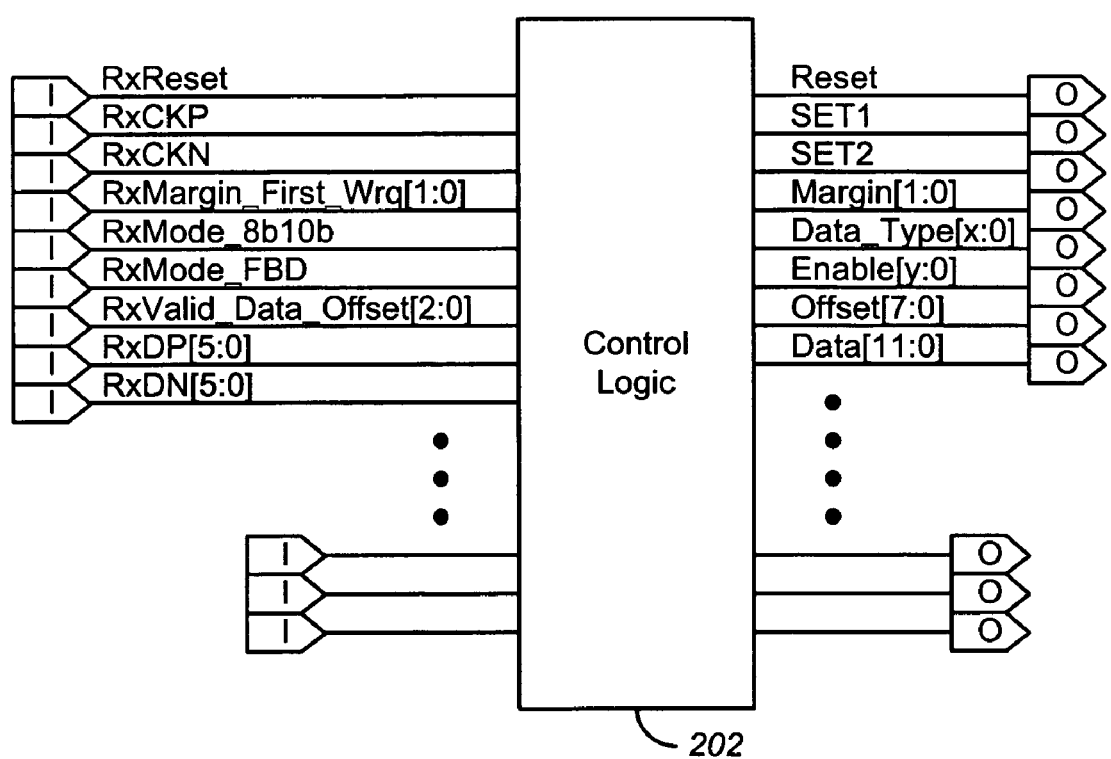
FIG. 3 illustrates exemplary data and control signals received by the control logic of the FIG. 2 apparatus.

FIG. 3 illustrates an exemplary embodiment of a portion of the control logic 202. As shown, the control logic 202 receives a serialized data flit (e.g., RxD[5:0] and RxDN[5:0]), as well as a corresponding clock or clocks (e.g., RxCKP and RxCKN). By way of example, the control logic 202 is shown to receive the serialized data flit as a two-bit serial data stream (RxDP/RxDN), synced to two 180 degree out-of-phase clocks (RxCKP/RxCKN). The control logic 202 then buffers and/or converts these signals and outputs the clocks SET1 and SET2, as well as the serialized data flit Data[11:0]. In some embodiments, the control logic 202 may perform data swapping (i.e., it may splice the data streams (RxDP/RxDN) beginning with a bit of the RxDP stream, or beginning with a bit of the RxDN stream. In alternate embodiments, the control logic 202 could be designed to receive only a single data stream and single clock.

By way of example, the length of each data stream (RxDP and RxDN) received by the control logic 202 is shown to be six bits. However, in some embodiments, the control logic 202 may be configured to receive 4, 5 or 6 bit data streams, which the apparatus 200 then converts into an 8 (WJF), 10 (8b10b) or 12 (FBD) bit wide bus synchronized with the clock domain of the device core 212. Because the length of a serialized data flit may change, the apparatus 200 is informed of the lengths of serialized data flits via various control signals (e.g., via data type indicators), as will be discussed below.

The control logic 202 may further receive a plurality of control signals. One of these control signals (RxReset) may initialize the control logic 202 to indicate the arrival of a serialized data flit (or plurality of serialized data flits). This signal (RxReset) may be buffered or qualified, and then output as the "Reset" signal.

Other control signals (RxMode_8b10b and RxMode_FBD) received by the control logic 202 may be indicative of a data flit's "data type". These data type control signals, as well as other control signals, may be buffered and/or combined and output as one or more signals Data_Type[x:0].

Another set of signals (RxMargin_First_Wrq[1:0]) received by the control logic 202 may indicate a delay margin. The signals RxMargin_First_Wrq[1:0] may be buffered and/or qualified and output as signals Margin[1:0]. The use of this margin will be described in more detail later in this description.

Yet another set of signals (RxValid_Data_Offset[2:0]) received by the control logic 202 may indicate an offset that should be maintained between 1) beginning to resolve a data flit's valid signal, and 2) receiving the serialized data flit. The 3-bit RxValid_Data_Offsetsignal may be decoded to yield the one-high Offset[7:0] signals.

Again, the signals that are received and output by the control logic 202 are merely exemplary, and some embodiments of the control logic 202 may receive and/or output more or fewer data and control signals. The signals that are received and output by the control logic 202 may also serve other purposes, some of which are only tangentially related to the method and apparatus for reducing synchronizer shadow that are disclosed herein. As a result, the control signals received by the control logic 202 will only be described to the extent that they have a bearing on reducing synchronizer shadow.

Figure 4:
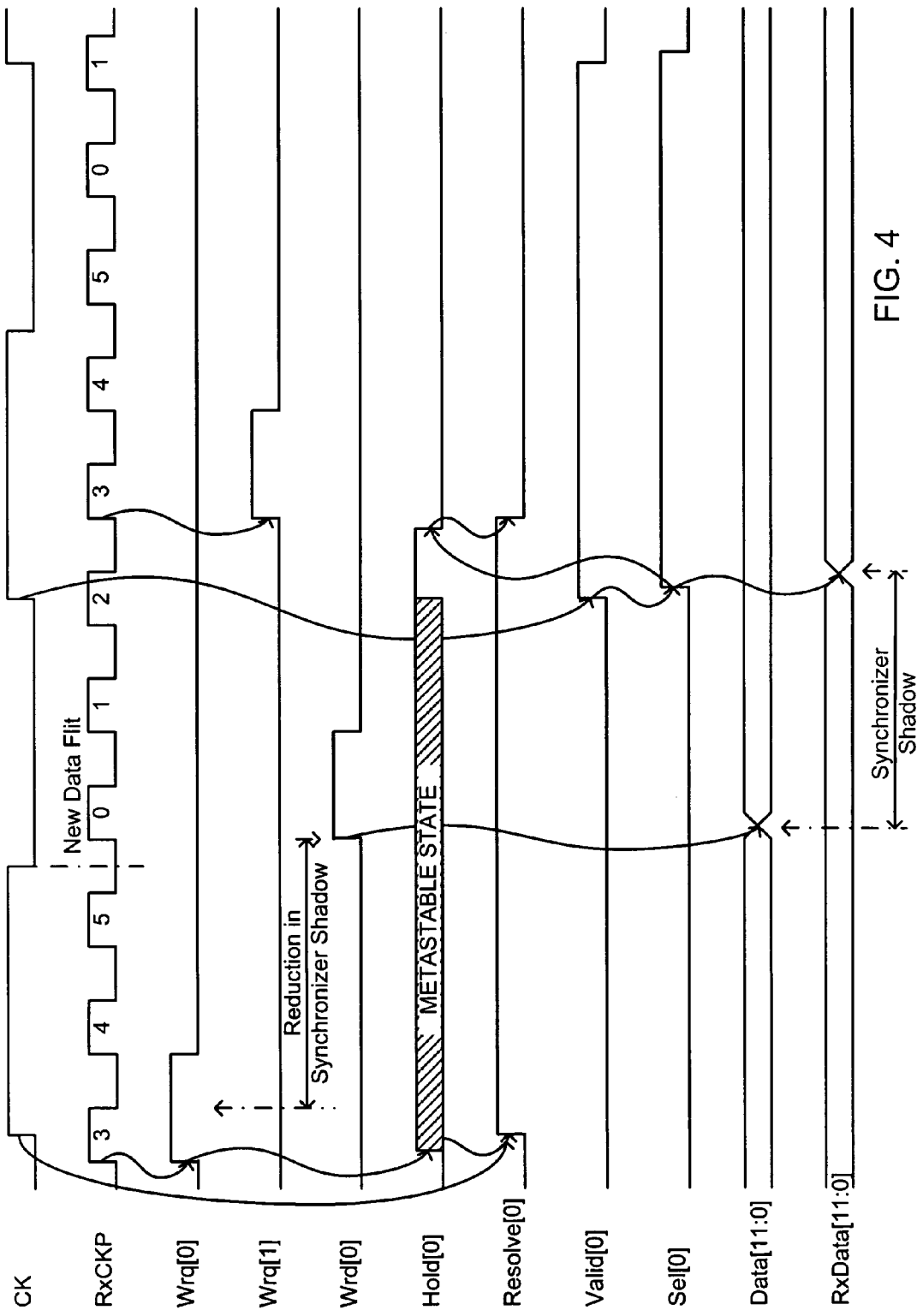
FIG. 4 illustrates exemplary timings of signals for the apparatus shown in FIGS. 2, 3 and 5-9.

Turning now to FIG. 4, there is illustrated the timing of various signals of the apparatus 200. At the top is a comparison of the signal CK (of the clock domain of the device core 212) to the signal RxCKP (which corresponds to the serialized data flit(s) received by the apparatus 200). By way of example, the clock RxCKP is shown to have an operating frequency that is about three times the frequency of the clock CK. However, given that the clocks RxCKP and CK are non-aligned, this correspondence could change. Also by way of example, the FIG. 4 timing diagram assumes that a received data flit comprises twelve bits of data, received over a period of six cycles of the clock RxCKP (numbered 0, 1, 2, 3, 4, 5 in FIG. 4). Also note that FIG. 4 shows the receipt of the last three cycles of data of a first serialized data flit (i.e., cycles 3, 4, 5), and the signals (Wrq[0], Wrd[1], Hold[0], Resolve [0], Valid[0] and Sel[0]) that are used to synchronize and transfer same into the clock domain of the device core 212. FIG. 4 also shows the receipt of all of a second serialized data flit, and the receipt of part of a third serialized data flit. However, FIG. 4 does not show all of the signals that are used to synchronize and transfer the second and third data flits into the clock domain of the device core 212.

The timing of the signals shown in FIG. 4 will be described in more detail below, in the context of descriptions of portions of the apparatus 200 that generate them.

Figure 5:
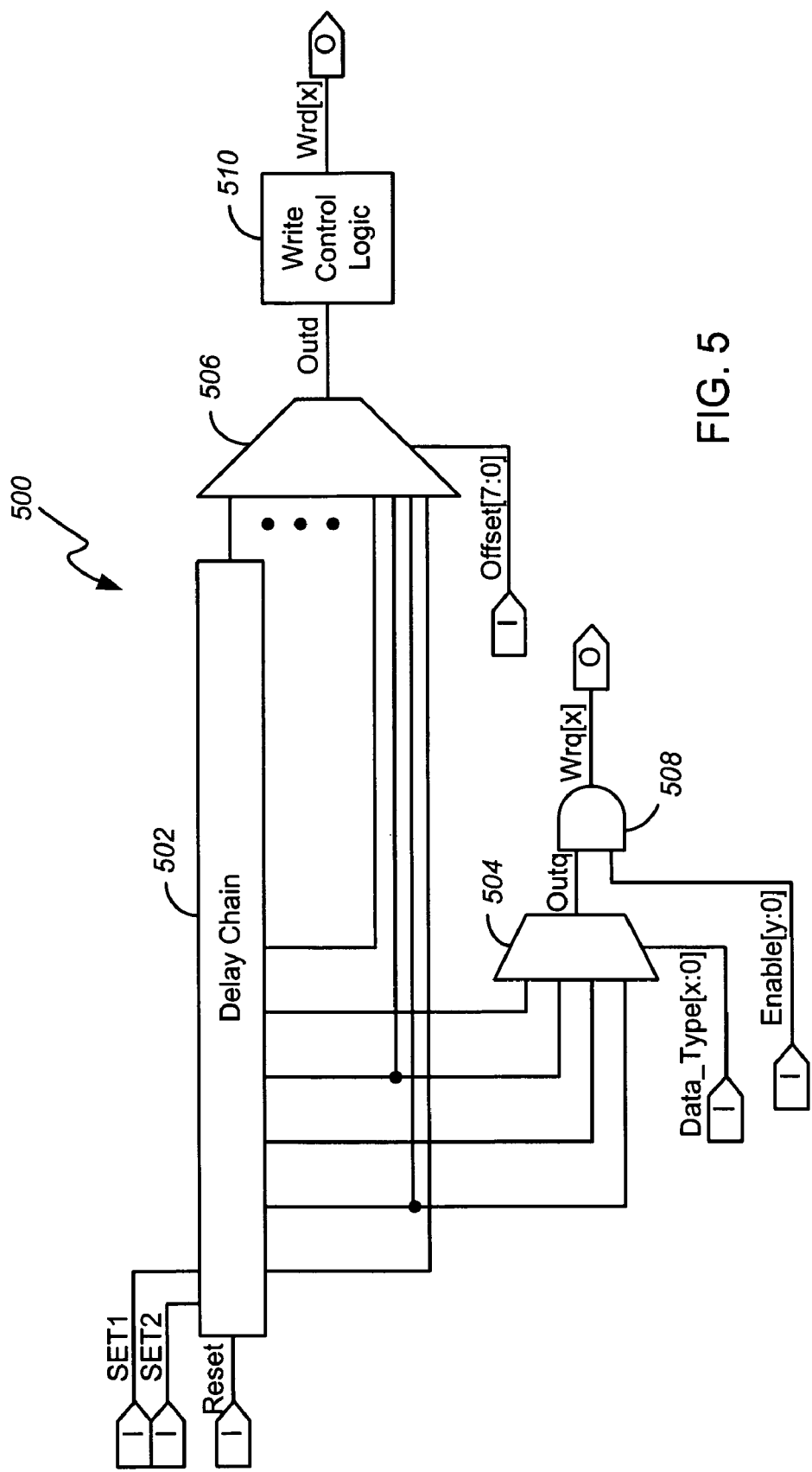
FIG. 5 illustrates an exemplary embodiment of a portion of the control logic shown in FIG. 2.

FIG. 5 illustrates an exemplary embodiment of a front-end logic portion 500 of the synchronizer 206 (FIG. 2). As shown, the circuit 500 comprises a delay chain 502 (e.g., a series chain of delay elements). The elements of the delay chain are clocked under control of the RxCK clock domain, and in one embodiment are clocked via the alternating clocks SET1 and SET2 (as shown).

The input to the delay chain is the "Reset" signal, which is indicative of the arrival of a new serialized data flit. The "Reset" signal loads the delay chain with 4, 5, or 6 logic "1"s, with the number of "1"s depending on the mode (or data type signals) received by the control logic 202 during initialization of the control logic 202. These ones may then loop through the delay chain aligned to the arriving data flits.

As shown, the outputs of a first plurality of delay elements are provided to a first multiplexer 504, and the outputs of a second plurality of delay elements are provided to a second multiplexer 506. In accord with one or more Data_Type[x:0] variables, the first multiplexer 504 outputs a signal, Wrq[x], that serves as a synchronizer control signal; and, in accord with one or more offset signals, Offset[7:0], the second multiplexer 506 outputs a signal, Wrd[x], that serves as a queue control signal. In some cases, the Wrq[x] signal may be modified or enabled (e.g., reset by the "Reset" signal) by synchronizer control logic 508. Similarly, the Wrd[x] signal may be modified or enabled by write control logic 510.

The delay chain 502 provides two primary functions. First, it provides the Wrd[x] signal upon full receipt of a data flit, thereby enabling capture (i.e., latching) of the data flit in the data queue 208 (FIG. 2). Second, it provides the Wrq[x] signal at a predetermined time before full receipt of the data flit. In this manner, and as will be explained in more detail later in this description, the Wrq[x] signal allows the synchronizer 206 to begin resolving a valid signal for the data flit before the data flit is fully received, thereby decreasing the duration of the synchronizer's "shadow".

If the delay chain 502 is made programmable (as shown), then the Wrd[x] signal may be programmed to rise at the end of data flits of different length, and/or the Wrq[x] signal may be programmed to occur a predetermined number of RxCKP cycles (or fractions thereof) prior to the Wrd[x] signal. In the circuit shown in FIG. 6, the temporal separation between Wrq[x] and Wrd[x] is controlled, in part, by the one-high set of control lines Offset[7:0].

In some embodiments, an instance of the circuit may be provided for each set of Wrd[x] and Wrq[x] signals (i.e., Wrd[0] and Wrq[0], tc.). In other embodiments, circuitry may be provided to sequentially couple the Wrd[x] and Wrq[x] signals to corresponding ones of the Wrd[7] and Wrq[7] signals.

Of note, the Wrq[x] and Wrd[x] signals are both generated in the clock domain of the link 210 (i.e., the RxCKP/N clock domain). Turning back to FIG. 4, an exemplary timing of the Wrq[0] and Wrd[0] signals is shown, wherein the Wrq[0] signal is generated three RxCKP cycles before the full receipt of a data flit, and the Wrd[0] is generated immediately after the data flit is received. For comparison to signal Wrq[0], the timing of the signal Wrq[1], corresponding to a next received data flit, is also shown in FIG. 4.

Figure 6:
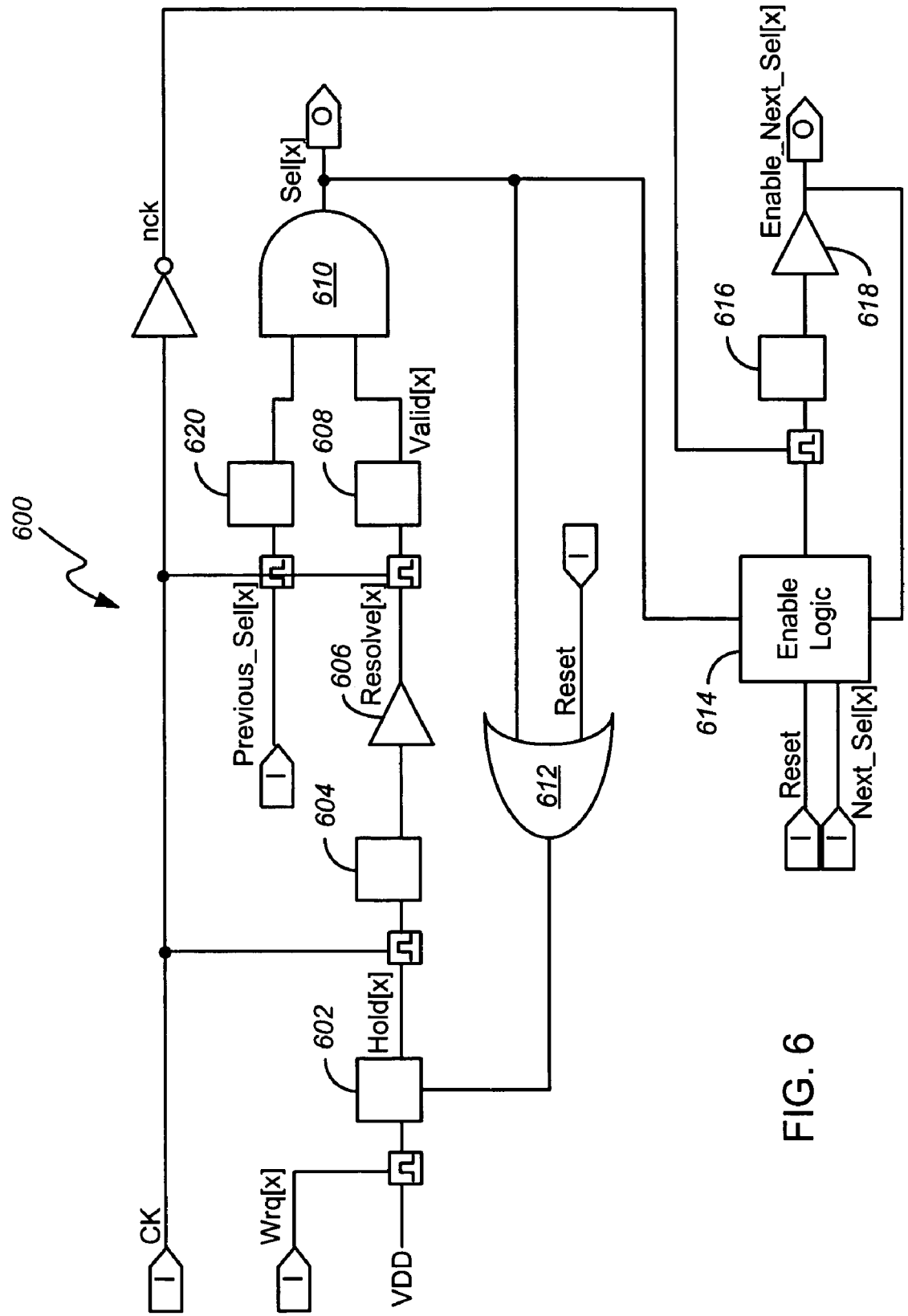
FIG. 6 illustrates an exemplary embodiment of a slice of the synchronizer shown in FIG. 2.
Figure 7:
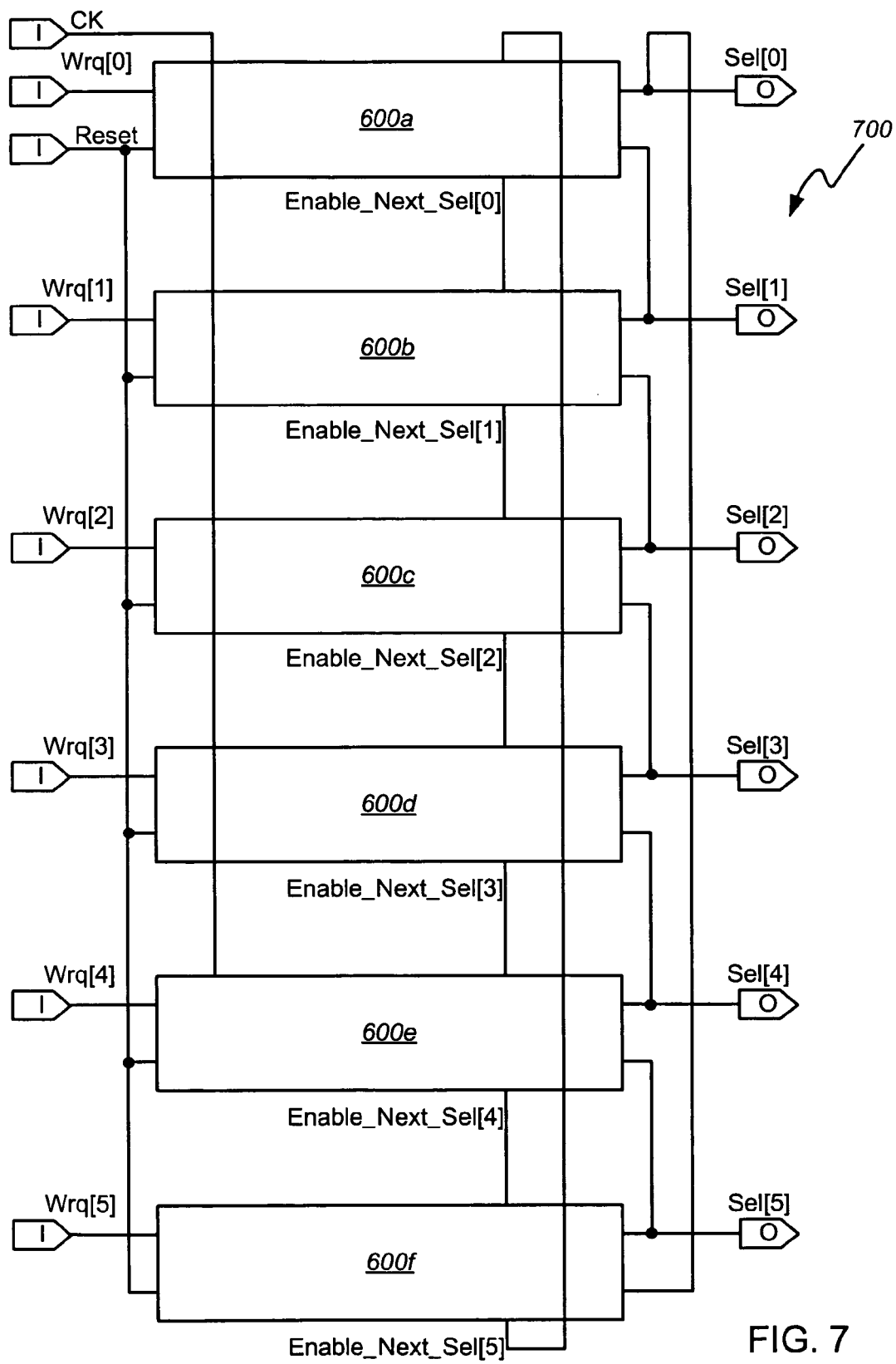
FIG. 7 illustrates an exemplary arrangement of a plurality of the synchronizer slices shown in FIG. 6.

FIG. 6 illustrates an exemplary embodiment of one slice 600 of the synchronizer 206 (FIG. 2). As shown in FIG. 7, the synchronizer 206 may comprises a slice 600 for each entry in the data queue 208.

The synchronizer slice 600 is initially triggered by receipt of the signal Wrq[x], which provides a pulse in the RxCKP/N clock domain that causes logic 602 to latch and output a "Hold[x]" signal. Note that the timing of the "Hold[x]" signal, and most signals mentioned in this paragraph, can be seen in FIG. 4. After output of the "Hold[x]" signal, and upon a rising edge of clock CK, logic 604, 606 produces a "Resolve [x]" signal in the OK domain. At the next rising edge of clock CK, logic 608 produces a "Valid[x]" signal. Upon enablement of logic 610, this "Valid" signal then synchronously produces a "Sel[x]" signal, which may be used to select data to be read out of the data queue 208 (and into the clock domain of the device core 212), as will be explained in more detail later in this description. Upon rise of the "Sel[x]" signal or upon receipt of a "Reset" signal (e.g., usinq the logic 612), the logic 602 is caused to once again disable (e.g., drive low) the "Hold[x]" signal, thereby resetting the synchronizer slice 600. Exemplary timings of the Hold[0], Resolve[0], Valid[0] and Sel[0] signals as shown in FIG. 4.

By means of the synchronizer slice 600, a data flit's "Valid" signal begins to resolve before the data flit is fully received, thereby enabling a reduction in synchronizer shadow as noted in FIG. 4. Also, the data flit's "Valid" signal is given a full clock cycle of the device core 212 to resolve, thereby giving a substantial period of time for the "Valid" signal to resolve, and enabling a relaxing of the design requirements of the synchronizer 206 and data queue 208 (FIG. 2).

FIG. 7 shows an exemplary arrangement 700 of a plurality of slices 600a-f of the synchronizer 206 (FIG. 2). Each slice 600a-f receives one of the Wrq[5:0] signals and produces a corresponding one of the Sel[5:0] signals. Each slice 600a-f also provides an Enable_Next_Sel[x] signal to the next sequential synchronizer slice, and also provides its Sel[x] signal to the previous synchronizer slice. In this manner, the Sel[5:0] signals are forced to enable in a sequential and repeating order.

Turning back to FIG. 6, there is shown exemplary logic for forcing the signals Sel[5:0] to enable in sequential and repeating order. The logic comprises enable logic 614 that, upon the "Reset" and next sequential one of the select signals (Next_Sel[x]) both being low, enables the next sequential one of the select signals to be asserted at a rising edge of the clock CK (e.g., via logic 616 and 618, and via the output signal "Enable_Next_Sel[x]"). Each one of the "Enable_Next_Sel [x]" signals is then received into the next sequential synchronizer slice as the signal "Previous_Sel[x]" (see FIG. 6), and upon a rising edge of the clock CK, enables logic 620 to enable the logic. 610.

Figure 8:
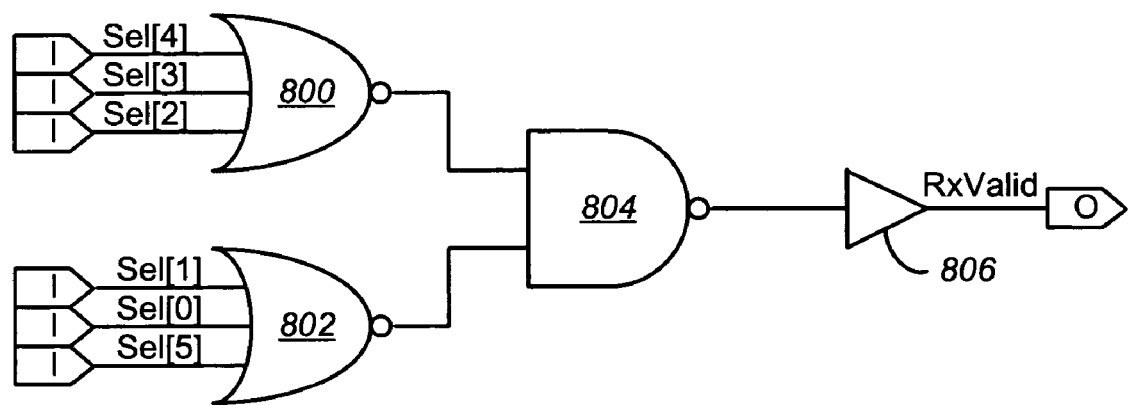
FIG. 8 illustrates exemplary logic for enabling a master data valid signal.

FIG. 8 illustrates exemplary logic 800, 802, 804 and 806 for producing (or enabling) a master data valid signal (RxValid). The master valid data signal is enabled upon resolving a valid signal for any of the entries of the data queue 208 (FIG. 2). As will be discussed later in this description, the logic 500 (FIG. 5) can be designed to keep the master valid data signal high continuously over the receipt of a plurality of sequentially received data flits. This can be especially advantageous when receiving data that expects to be transmitted over a synchronous interface (such as FBD data).

Figure 9:
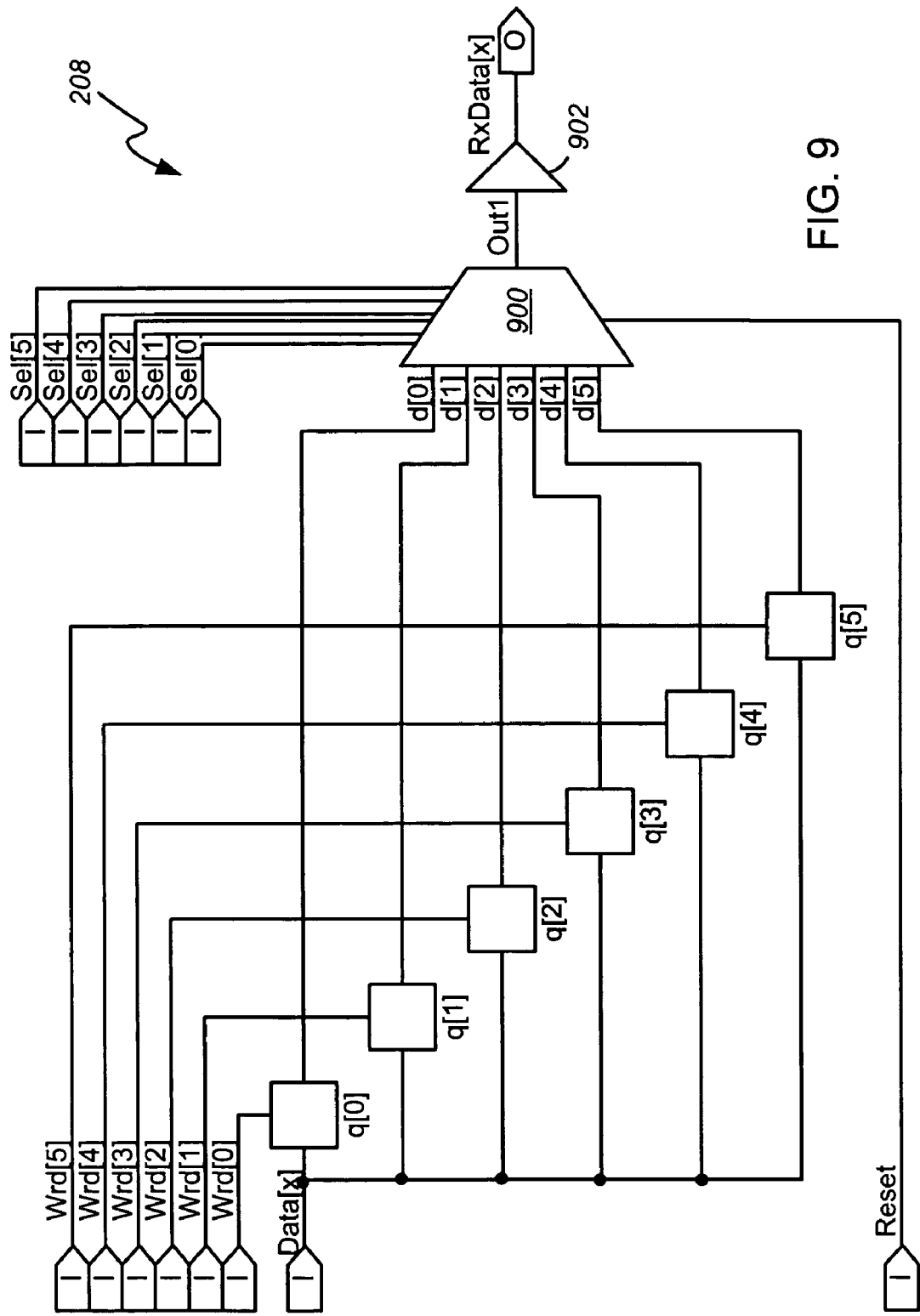
FIG. 9 illustrates an exemplary embodiment of the data queue shown in FIG. 2.

Upon deserializing a serialized data flit under control of a first clock domain, via the deserializer 204 (FIG. 2), data is then latched into one or more entries of a data queue 208, in response to one or more of the queue control signals Wrd[x]. As shown in FIG. 9, and in one exemplary embodiment, each bit (Data[x]) of a deserialized data flit may be latched into one entry (i.e., one of q[5:0]) of the data queue 208 in response to a corresponding one of the write signals Wrd[5:0]. Thus, for example, upon receipt of a first data flit, Data[x] may be latched into queue entry q[0]; upon receipt of a second data flit, Data[x] may be latched into queue entry q[1]; and so on. In a somewhat similar fashion, data is transferred out of the data queue 208 via a multiplexer 900 (and possibly buffered by a buffer 902). That is, data inputs of the multiplexer 900 are coupled to respective entries q[5:0] of the data queue 208, and control inputs of the multiplexer 900 are coupled to respective ones of the select signals Sel[5:0]. Then, as each of the select signals Sel[5:0] is asserted, data d[5:0] from a corresponding one of the queue entries q[5:0] is transferred from the clock domain of the link 210 to the clock domain of the device core 212.

As should be apparent after reading the above description, the method 100 and apparatus 200 provide a means for reducing synchronizer shadow. As shown by the exemplary signal timings of FIG. 4, synchronizer shadow may be reduced by more than half. In fact, depending on the type of data being received, and the chosen offset (i.e., Offset[7:0]), synchronizer shadow (and usually latency) can sometimes be reduced to about one cycle of the link clock domain (i.e., one cycle of clock RxCKP or RxCKN). The greater the offset, the lower the latency. However, if the offset is too large, data collisions may occur.

The method 100 and apparatus 200 disclosed herein can also be configured to allow asynchronous interface circuits to be used with link protocols (e.g., FBD) that expect a synchronous interface. As described below, this can be accomplished using simple digital control logic instead of complex analog clock alignment circuits.

In FBD mode, the link and core clocks are derived from the same reference clock and have matched bandwidths, but there is no alignment between the clock domains. This creates a pseudo-synchronous clock boundary between the deserializer 204 (FIG. 2) and the FBD data. A problem, however, is that the link and core clocks can align such that their synchronization is not predictable. If this occurs, RxValid (FIG. 8) could go low at any time and cause the FBD link controller to fail.

To ensure that the above-described situation does not occur, the first write into the data queue 208 (FIG. 2) can be delayed. See, for example, the pulse 1100 (FIG. 11) which is delayed by ½ RxCKP cycle as compared to the pulse 1000

(FIG. 10). This forces the RxValid signal to stay low for one additional cycle at the beginning of time, yet stay continuously valid thereafter—thereby making it appear to the FBD link controller that the RxCKP/N and CK clock domains are in sync and aligned, when in fact they are not. The "missed" data is "caught" and written into (and transferred out of) the data queue 208 one CK cycle later. Of note, this solution only adds latency when there is minimal margin, so it is hard to say if it truly adds latency. The amount of delay added to the first synchronization is determined by the RxMargin_First_Wrq [1:0] signal (FIG. 3), which the control logic 202 may combine into the Data_Type[x:0] signal that serves to control the multiplexer 504 in FIG. 5. Lower margin means there is less chance of adding unnecessary latency. Fundamentally, this solution trades clock alignment circuits which are typically analog designs that consume a lot of area, power, risk, et cetera, for a small synchronization penalty (½ to 1 RxCKP/N cycle). However, this penalty may be offset by, for example, reducing synchronizer shadow using the method 100 or apparatus 200.

What is claimed is:

1. A method for reducing synchronizer shadow, comprising:
a deserializer receiving and deserializing a serialized data flit of known length, under control of a first clock domain;
before receiving all of the serialized data flit, a synchronizer beginning to resolve a valid signal for the deserialized data flit in a second clock domain;
upon receiving and deserializing all of the serialized data flit, latching the deserialized data flit under control of the first clock domain; and
after latching the deserialized data flit, and a predetermined number of clock edges of the second clock domain after beginning to resolve the valid signal, i) resolving the valid signal; and ii) transferring the latched data flit into the second clock domain in response to the valid signal.

2. The method of claim 1, further comprising, beginning to resolve the valid signal in response to a data type of the serialized data flit.

3. The method of claim 1, further comprising, adjusting the predetermined number of clock edges, between beginning to resolve the valid signal and resolving the valid signal, in response to an offset signal received for the serialized data flit.

4. The method of claim 1, further comprising:
beginning to resolve the valid signal in response to a data type of the serialized data flit; and
setting the predetermined number of clock edges in response to an offset signal received for the serialized data flit.

5. The method of claim 1, further comprising:
receiving a sequential plurality of serialized data flits; and
delaying the resolve of a valid signal for a first of the serialized data flits when the plurality of serialized data flits have a data type that expects a synchronous interface.

6. The method of claim 5, wherein the data type is fully Buffered DIMM (FBD).

7. Apparatus for reducing synchronizer shadow, comprising:
a deserializer to, under control of a first clock domain, receive and deserialize a serialized data flit of known length;
logic to, under control of the first clock domain, receive a signal indicative of arrival of the serialized data flit and, in response thereto, generate i) a queue control signal for latching the deserialized data flit under control of the first clock domain, and ii) a synchronizer control signal for beginning a resolve of a valid signal for the deserialized data flit in a second clock domain, the synchronizer control signal being timed to occur a predetermined time before the queue control signal;
a synchronizer, under control of the second clock domain, to receive the synchronizer control signal and i) before receiving all of the serialized data flit, begin to resolve a valid signal for the deserialized data flit, and ii) after receiving all of the serialized data flit, resolving the valid signal; and
a data queue to latch the deserialized data flit in response to the queue control signal, and to transfer the latched data flit into the second clock domain in response to the valid signal.

8. The apparatus of claim 7, wherein the logic comprises:
a delay chain having a plurality of delay elements; and
a multiplexer to receive outputs from a plurality of the delay elements, and to output the synchronizer control signal in response to a data type of the serialized data flit.

9. The apparatus of claim 8, wherein:
the apparatus receives a sequential plurality of serialized data flits; and
the multiplexer has control inputs that, for a first of the serialized data flits, and in response to the plurality of serialized data flits having a data type that expects a synchronous interface, cause the multiplexer to output a signal derived from a downstream one of the plurality of delay elements.

10. The apparatus of claim 9, wherein the data type is Fully Buffered DIMM (FBD).

11. The apparatus of claim 7, wherein the logic comprises:
a delay chain having a plurality of delay elements; and
a multiplexer to receive outputs from a plurality of the delay elements, and to output the queue control signal in response to an offset signal received for the serialized data flit.

12. The apparatus of claim 7, wherein the logic comprises:
a delay chain having a plurality of delay elements;
a first multiplexer to receive outputs from a first plurality of the delay elements, and to output the synchronizer control signal in response to a data type of the serialized data flit; and
a second multiplexer to receive outputs from a second plurality of the delay elements, and to output the queue control signal in response to an offset signal transmitted for the serialized data flit.

13. The apparatus of claim 12, wherein:
the apparatus receives a sequential plurality of serialized data flits; and
the first multiplexer has control inputs that, for a first of the serialized data flits, and in response to the plurality of serialized data flits having a data type that expects a synchronous interface, cause the first multiplexer to output a signal derived from a downstream one of the plurality of delay elements.

14. The apparatus of claim 13, wherein the data type is Fully Buffered DIMM (FBD).

15. The apparatus of claim 7, wherein the data queue comprises a plurality of entries to store a plurality of sequentially received data flits; and wherein the synchronizer sequentially resolves a valid signal for each entry of the data queue.

16. The apparatus of claim 15, further comprising logic to, upon resolving a valid signal for any of the entries of the data queue, enabling a master data valid signal.

17. The apparatus of claim 15, further comprising a data queue multiplexer having i) data inputs coupled to respective entries of the data queue, and ii) control inputs coupled to receive signals derived from the valid signals for the entries of the data queue.

18. The apparatus of claim 7, wherein:
the apparatus receives a sequential plurality of serialized data flits; and
for a first of the serialized data flits, and in response to the plurality of serialized data flits having a data type that expects a synchronous interface, the logic delays the resolve of a valid signal for a first of the serialized data flits.

19. The apparatus of claim 18, wherein the data type is Fully Buffered DIMM (FBD).

20. An apparatus, comprising:
a deserializer to, under control of a first clock domain, receive and deserialize serialized data flits of different but known lengths; and
a synchronizer that, in response to a data type of each deserialized data flit, and for each deserialized data flit, generates control signals to:
i) begin resolving a valid signal for the deserialized data flit, before the deserialized data flit is fully received; ii) latch the deserialized data flit under control of a first clock domain; and iii) transfer the latched data flit into a second clock domain in response to the valid signal.

* * * * *

UNITED STATES PATENT AND TRADEMARK OFFICE
CERTIFICATE OF CORRECTION

PATENT NO. : 7,515,667 B2
APPLICATION NO. : 11/271398
DATED : April 7, 2009
INVENTOR(S) : Carson D. Henrion It is certified that error appears in the above-identified patent and that said Letters Patent is hereby corrected as shown below:

In column 3, line 14, delete "RxD[5:0]" and insert -- RxDP[5:0] --, therefor.

In column 3, line 59, delete "Offsetsignal" and insert -- Offset[2:0] signal --, therefor.

In column 5, line 11, delete "Wrd[7] and Wrq[7]" and
insert -- Wrd[7:0] and Wrq[7:0] --, therefor.

In column 5, line 33, delete "OK" and insert -- CK --, therefor.

In column 5, line 40, delete "usinq" and insert -- using --, therefor.

In column 10, line 9, in Claim 20, after "flit" delete ",".

Signed and Sealed this

Eighth Day of September, 2009

David J. Kappos
*Director of the United States Patent and Trademark Office*